United States Patent
Shahar et al.

(10) Patent No.: US 9,891,328 B2
(45) Date of Patent: Feb. 13, 2018

(54) SYSTEMS AND METHODS FOR REDUCED SIZE DETECTOR ELECTRONICS

(71) Applicant: General Electric Company, Schenectady, NY (US)

(72) Inventors: Arie Shahar, Moshav Magshimim (IL); Avishai Ofan, Modiin (IL); Jeffrey Michael Levy, Tel-Aviv (IL); Moshe Cohen-Erner, Even Yehuda (IL); Yaron Glazer, Rehovot (IL)

(73) Assignee: General Electric Company, Schenectady, NY (US)

( * ) Notice: Subject to any disclaimer, the term of this patent is extended or adjusted under 35 U.S.C. 154(b) by 148 days.

(21) Appl. No.: 14/871,033

(22) Filed: Sep. 30, 2015

(65) Prior Publication Data

US 2017/0090047 A1 Mar. 30, 2017

(51) Int. Cl.
*G01T 1/24* (2006.01)
*H04N 5/347* (2011.01)
*H01L 27/146* (2006.01)

(52) U.S. Cl.
CPC ............ *G01T 1/247* (2013.01); *H01L 27/146* (2013.01); *H01L 27/14605* (2013.01); *H04N 5/347* (2013.01)

(58) Field of Classification Search
CPC ............ H01L 27/146; H01L 27/14605; H01L 27/14603
See application file for complete search history.

(56) References Cited

U.S. PATENT DOCUMENTS

| | | | |
|---|---|---|---|
| 3,848,129 A | 11/1974 | Figler et al. | |
| 4,578,578 A | 3/1986 | Lin et al. | |
| 6,657,200 B2 | 12/2003 | Nygard et al. | |
| 7,291,839 B1 | 11/2007 | Demers et al. | |
| 7,352,827 B2 | 4/2008 | Earls et al. | |
| 8,405,038 B2* | 3/2013 | Bouhnik | G01T 1/249 250/370.14 |
| 9,057,791 B2* | 6/2015 | Hannemann | G01T 1/243 |

(Continued)

OTHER PUBLICATIONS

K. Behringer and J. Pineyro; Remarks about the Displaced Spectra Techniques; Paul Scherrer Institute. CH-5303; Wurenlingen, Switzerland; Jul. 21, 1998.

(Continued)

*Primary Examiner* — Kenneth J Malkowski
(74) *Attorney, Agent, or Firm* — Dean D. Small; The Small Patent Law Group, LLC

(57) ABSTRACT

A radiation detector processing assembly is provided including at least one application specific integrated circuit (ASIC). The radiation detector processing assembly includes plural input channels, a common readout, and a readout channel. Each input channel is configured to receive an input corresponding to a detection event from a pixel of a pixelated detector. The common readout is operably coupled to the plural input channels, and is configured to receive a corresponding output signal from each input channel. Each corresponding output signal has a unique address identifying the corresponding input channel. The readout channel is configured to receive a corresponding readout output from the common readout. The readout output includes output signals from a corresponding group of input channels.

14 Claims, 7 Drawing Sheets

(56) References Cited

U.S. PATENT DOCUMENTS

| | | | | |
|---|---|---|---|---|
| 2006/0056581 | A1* | 3/2006 | Hoffman | A61B 6/032 378/19 |
| 2011/0127415 | A1* | 6/2011 | Kanter | G01J 1/44 250/252.1 |
| 2014/0048714 | A1* | 2/2014 | Shahar | G01T 1/247 250/370.08 |
| 2016/0305818 | A1* | 10/2016 | Ichikawa | H04N 5/32 |

OTHER PUBLICATIONS

J. Pineyro and K. Behringer; Displaced Spectra Techniques as a Tool for Peak Identification in PSD-Analysis; Progress in Nuclear Energy; 1998; vol. 21; pp. 635-643.

U. Jagadish, C. L. Britton, JR, M. N. Ericson, W.L. Bryan, W. G. Schwarz, M. E. Read and R. A. Kroeger; A Preamplifier-Shaper-Stretcher Integrated Circuit System for Use with Germanium Strip Detectors; Oak Bridge National Laboratory; 4 pages.

* cited by examiner

SYSTEMS AND METHODS FOR REDUCED SIZE DETECTOR ELECTRONICS

BACKGROUND

The subject matter disclosed herein relates generally to medical imaging systems, and more particularly to radiation detection systems.

In nuclear medicine (NM) imaging, such as single photon emission computed tomography (SPECT) or positron emission tomography (PET) imaging, radiopharmaceuticals are administered internally to a patient. Detectors (e.g., gamma cameras, X-Ray cameras, and detectors and cameras for ionizing radiation), typically installed on a gantry, capture the radiation emitted by the radiopharmaceuticals and this information is used, by a computer, to form images. The NM images primarily show physiological function of, for example, the patient or a portion of the patient being imaged. Smaller pixel sizes may be utilized to improve energy and/or spatial resolution. Use of a larger number of smaller pixels, however, results in a larger number of signals to be acquired and processed, increasing the size and expense of the associated electronics. As pixel size becomes smaller, practical limits of board sizes may be reached or exceeded. Such board-size limitations may occur in Z-assembly when an electronic board, including electronic-chips (e.g., Memories, FPGA's, or ASIC's), is attached directly, by interconnections, onto a semiconductor radiation-detector. The board should not exceed the detector size. For example, as electronic chips, such as ASIC's, become larger to be able to process larger number of electronic-signals, stresses and strains due to thermal expansion between electronics and a substrate may result in increased failures of electronics.

BRIEF DESCRIPTION

In accordance with an embodiment, a radiation detector processing assembly is provided including at least one application specific integrated circuit (ASIC). The radiation detector processing assembly includes plural input channels, a common readout, and a readout channel. Each input channel is configured to receive an input corresponding to a detection event from a pixel of a pixelated detector. The common readout is operably coupled to the plural input channels, and is configured to receive a corresponding output signal from each input channel. Each corresponding output signal has a unique address identifying the corresponding input channel. The readout channel is configured to receive a corresponding readout output from the common readout. The readout output includes output signals from a corresponding group of input channels.

In accordance with another embodiment, a radiation detector assembly is provided that includes a pixelated detector, plural pixelated anodes, and a radiation detector processing assembly. The pixelated detector has a surface. The pixelated anodes are disposed on the surface. (It may be noted that the detector may have a cathode that is disposed on a surface opposite to the surface on which the pixelated anodes are disposed.) Each pixelated anode is configured to generate a signal responsive to reception of a photon by the pixelated anode. The radiation detector processing assembly includes at least one application specific integrated circuit (ASIC). The radiation detector processing assembly includes plural input channels, a common readout, and a readout channel. Each input channel is coupled to a corresponding pixelated anode of the pixelated detector and is configured to receive an input corresponding to a detection event from the corresponding pixelated anode. The common readout is operably coupled to the plural input channels, and is configured to receive a corresponding output signal from each input channel. Each corresponding output signal has a unique address identifying the corresponding input channel. The readout channel is configured to receive a corresponding readout output from the common readout. The readout output includes output signals from a corresponding group of input channels.

In accordance with another embodiment, a method is provided. The method includes providing a pixelated detector having a surface and plural pixelated anodes disposed on the surface, with each pixelated anode configured to generate a signal responsive to reception of a photon by the pixelated anode. The method also includes operably coupling the pixelated detector to a radiation detector processing assembly comprising at least one application specific integrated circuit (ASIC). Each pixelated anode of the pixelated detector is communicably coupled with a corresponding input channel of the radiation detector processing assembly. Each input channel is configured to receive an input corresponding to a detection event from the corresponding pixelated anode of the pixelated detector. Further, the method includes communicably coupling a common readout to the plural input channels. The common readout is configured to receive a corresponding output signal from each input channel. Each corresponding output signal has a unique address identifying the corresponding input channel. Also, the method includes communicably coupling a readout channel to the common readout, the readout channel configured to receive a corresponding readout output from the common readout, the readout output comprising output signals from a corresponding group of input channels.

DETAILED DESCRIPTION

Figure 1:
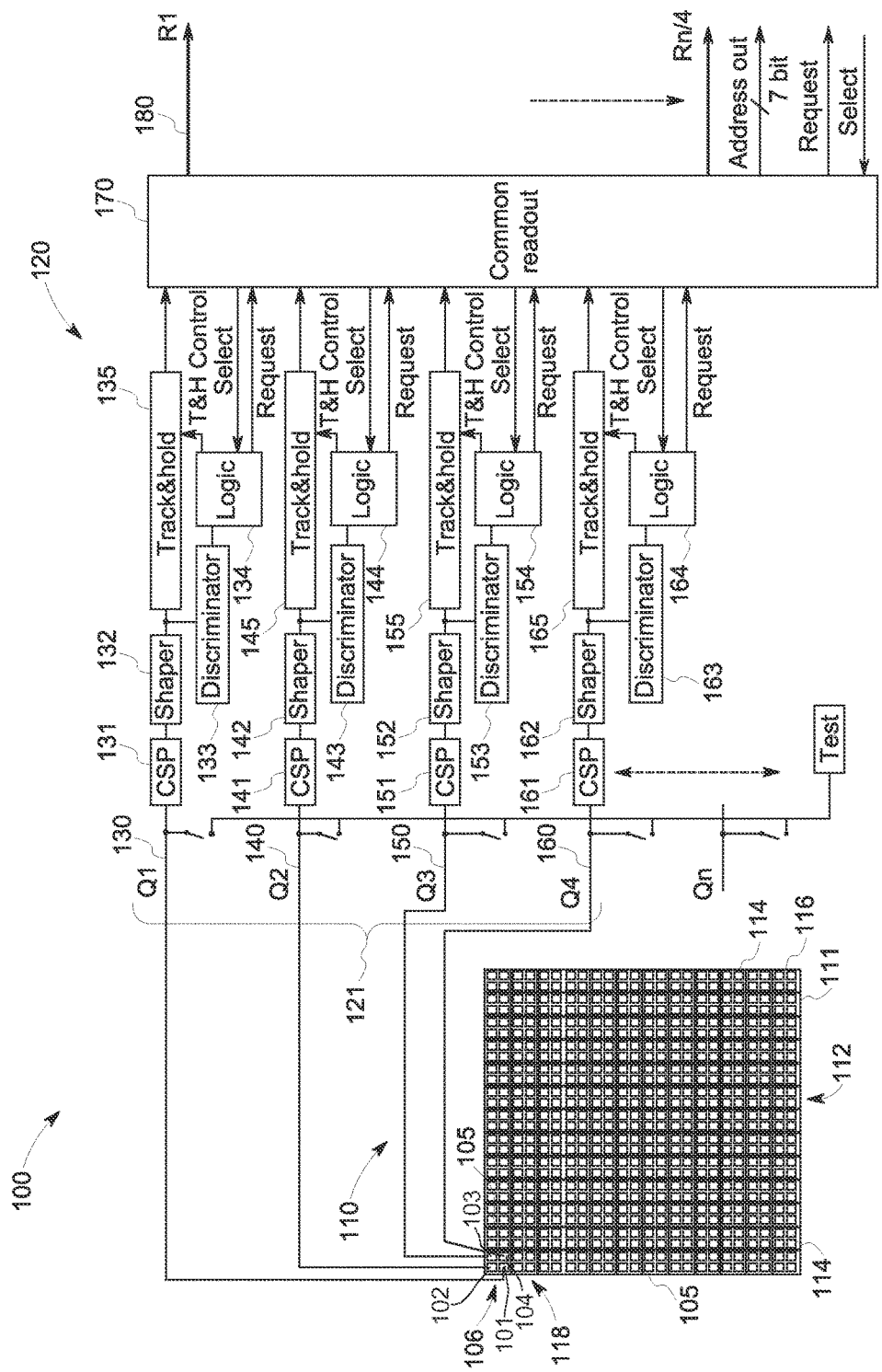
FIG. 1 provides a schematic view of a radiation detector assembly according to an embodiment.

The foregoing summary, as well as the following detailed description of certain embodiments and claims, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for improving energy resolution and/or spatial resolution while reducing the total size of electronics (e.g., boards, chips) relative to the total number of pixels. For example, in various embodiments, the pixel size may be reduced to improve energy resolution and/or spatial resolution. Reduction in pixel size reduces the pixel leakage-current and the pixel capacitance, and, accordingly, improves the energy resolution. Also, reducing pixel size may improve the intrinsic spatial resolution.

However, it may be noted that reducing pixel size while maintaining overall detector surface area increases the number of pixels. For example, reducing the pitch size by a factor of N increases the number of pixels by a factor of $N^2$. Increasing the number of pixels by a factor of $N^2$ may also increase the number of electronic-channels (or simply channels) in an ASIC by a factor of $N^2$ as well. For instance, reducing the pitch size by a factor of 2, without changing the configuration of associated electronics, increases the number of channels in an ASIC (or ASICs) by a factor of 4, resulting in an increase in silicon area of the ASIC (or ASICs) by a factor of 4. Increasing the silicon area may result in one or more drawbacks. For example, increasing the silicon area may reduce the manufacturing yield and increase the cost of the ASIC. Further, the silicon area may become too large to be mounted on an Analog Front End (AFE) board that is attached onto the detector by an array of interconnections. Increased silicon area may result in high power and heat generation/dissipation. Also, an increased number of I/O pads may present challenges for wire bonding. Additionally, the larger the dimensions of an ASIC, the more sensitive the ASIC becomes to thermal-stress and board bending, reducing the reliability of the detector.

Various embodiments reduce the number of channels and silicon area relative to the number of pixels, for example, by utilizing readout channels that share plural input channels. Additionally or alternatively, various embodiments reduce the silicon area relative to the number of pixels by sharing components, such as a track and hold circuit portion, among plural input channels. In some embodiments, an offset identifying a corresponding input channel is utilized to distinguish between signals from different input channels that are combined in a shared readout channel.

A technical effect of at least one embodiment includes improved image quality (e.g., due to improving energy resolution and/or spatial resolution). A technical effect of at least one embodiment includes facilitating reduced pixel sizes (e.g., by allowing for a reduced rate of increase in size of electronics relative to increase in pixel number). A technical effect of at least one embodiment includes reduced electronic costs (e.g., by reducing the number of components and/or size of components). A technical effect of at least one embodiment includes improved electronics reliability (e.g., by reducing the size and/or number of electronic components such as ASIC's.)

FIG. 1 provides a schematic view of a radiation detector assembly 100 in accordance with various embodiments. As seen in FIG. 1, the radiation detector assembly 100 includes an acquisition unit 110 and a processing assembly 120. Generally, the acquisition unit 110 is configured to generate electrical signals responsive to received radiation. The processing assembly 120 is configured to receive the generated signals from the acquisition unit 110, and provide a readout that may be used to track the number and location of received radiation events for use in reconstructing an image. In various embodiments, the processing assembly 120 may be configured to process information from the readout-unit (or simply readout) and to reconstruct an image.

The acquisition unit 110 includes a pixelated detector 112 and a collimator 116. The pixelated detector 112 has a surface 111 on which plural pixelated anodes 114 are disposed. The collimator 116 includes openings which may be registered to one or more pixels of the pixelated detector 112, with the collimator 116 configured to permit photons within a desired angular range of approach to impact one or more pixels, while blocking other photons. In various embodiments a cathode (not shown in FIG. 1) may be disposed on a surface opposite the surface 111 on which the pixelated anodes 114 are disposed. For example, a single cathode may be deposited on one surface with the pixelated anodes disposed on an opposite surface. Generally, when radiation (e.g., one or more photons) impacts the detector volume under the pixelated anodes 114, the pixelated detector 112 generates one or more electrical signals corresponding to the radiation penetrating via the cathode surface opposite the surface 111 and being absorbed in the volume of detector 110 under surface 111. Each pixelated anode 114, for example, may have a surface area of 2.5 millimeters square; however, other sizes and/or shapes may be employed in various embodiments.

The pixelated detector 112 in various embodiments may be a semiconductor detector, and may be constructed using different materials, such as semiconductor materials, including Cadmium Zinc Telluride (CdZnTe), often referred to as CZT, Cadmium Telluride (CdTe), and Silicon (Si), among others. The pixelated detector 112 may be configured for use with, for example, nuclear medicine (NM) imaging systems, positron emission tomography (PET) imaging systems, single photon emission computed tomography (SPECT) imaging systems, and/or computed tomography (CT).

In the illustrated embodiment, each pixelated anode 114 generates a signal based on a detection event, or the absorption of one or more photons in the volume of the pixelated detector 112 under the surface 111. The volumes of the pixelated detector 112 under the pixelated anodes 114 are defined as voxels (not shown). For each pixelated anode 114, the pixelated detector 112 has a corresponding voxel.

Each pixelated anode 114 may have associated therewith one or more electronics channels configured to provide electronic signals to one or more aspects of the detector processing assembly 120 in cooperation with the pixelated anodes. In some embodiments, all or a portion of each electronics channel may be disposed on the pixelated detector 112 and attached to it by an array of interconnections. Alternatively or additionally, all or a portion of each electronics channel may be housed externally to the pixelated detector 112, for example as part of the processing assembly 120, which may be or include an Application Specific Integration Circuit (ASIC). The electronics channels may be configured to provide the signals to one or more aspects of the processing assembly 120 while discarding other signals. For example, in some embodiments, each electronics channel includes a threshold discriminator. The threshold discriminator may allow signals exceeding a threshold level to be transmitted while preventing or inhibiting transmission of signals that do not exceed a threshold level. Generally, the threshold level is set low enough to reliably capture true detection events, while still being set high enough to exclude lower strength signals, for example due to noise. In some embodiments, each input channel includes a peak-and-hold unit to store electrical signal energy, and may also include or be associated with a readout mechanism. For example, the electronic channel may include a request-acknowledge mechanism that allows the peak-and-hold energy and pixel location for each electronic channel to be read out individually. Further, in some embodiments, the processing assembly 120 or other processor may control the signal threshold level and the request-acknowledge mechanism.

In the illustrated embodiment, the detector processing assembly 120 includes plural input channels Q1 (or first input channel 130), Q2 (or second input channel 140), Q3 (or third input channel 150), Q4 (or fourth input channel 160) . . . Qn. Each input channel is configured to receive an input corresponding to a detection event from a corresponding pixelated anode 114 (or pixel) of the pixelated detector 112.

The detector processing assembly 120 also includes a common readout 170. The common readout 170 is coupled to the plural input channels Q1, Q2, Q3, Q4, . . . Qn. The common readout 170 is configured to receive a corresponding output signal from each input channel (e.g., an output signal, generated by each input channel, from each input signal responsive to a detection event of a pixel of the pixelated detector 112 corresponding to the input channel). Each corresponding output signal (e.g., signal from an input channel to the common readout 170) has a unique address and/or path identifying the corresponding input channel. The common readout 170 may be included inside an ASIC as integral part of the ASIC or, for example, may include a field programmable gate array (FPGA). The path or digital address of a path for request and select signals for a given input channel may correspond to the address or location of a particular corresponding pixel and be used to discriminate between signals provided by different input channels (and thus different pixels) to allow for accurate reading out of events for specific pixels and/or groups of pixels.

The detector processing assembly 120 depicted in FIG. 1 also includes a readout channel R1 (or first readout channel 180). The readout channel R1 receives a corresponding readout output from the common readout 170. The readout output received by the readout channel R1 includes any output signals generated over the course of an imaging scan from a corresponding group of input channels. In the embodiment depicted in FIG. 1, the readout channel R1 receives, via the common readout 170, the input channels Q1, Q2, Q3, and Q4 form a first group 121, with the outputs from input channels Q1, Q2, Q3, and Q4 (or first group 121) received by the readout channel R1. In the illustrated embodiment, by using multiple (e.g., four) input channels per readout channel, less readout channels are required, freeing up space on an ASIC and/or making the detector processing assembly 120 have a smaller area or footprint.

Further, in various embodiments, plural readout channels, each generally similar to R1 (or first readout 180) may be included in the detector processing assembly 120, with each readout channel configured to receive corresponding readout outputs that include output signals from corresponding groups of input signals. For example, in the illustrated embodiment, input channels Q1, Q2, Q3, Q4 may provide outputs that are routed via the common readout 170 to readout channel R1. Further, input channels Q5, Q6, Q7, Q8 (generally similar to input channels Q1, Q2, Q3, Q4; not shown in FIG. 1 for clarity and ease of illustration) may provide outputs that are routed via the common readout 170 to readout channel R2 (generally similar to readout channel R1; not shown in FIG. 1 for clarity and ease of illustration). Multiple groups of input channels may provide signals to corresponding readout channels, for example up to a group of input channels including Q(n−3), Q(n−2), Q(n−1), Qn providing signals to readout channel R(n/4).

As seen in FIG. 1, for the illustrated embodiment, the detector processing assembly 120 includes an integrator circuit portion 131, a shaper circuit portion 132, a discriminator circuit portion 133, a logic circuit portion 134, and a track and hold circuit portion 135 that are a part of or associated with the first input channel (or simply channel) 130. The integrator circuit portion 131, for example, may include a charge sensitive preamplifier. The integrator circuit portion 131 may receive a charge produced inside the pixelated detector 112 and provide an output signal to the shaper circuit portion 132.

The illustrated shaper circuit portion 132 receives a signal from the integrator circuit portion 131 and provides an output to the discriminator circuit portion 133 and the track and hold circuit portion 135. The shaper circuit portion 132 may include a band-pass filter, and be configured to remove noise (thereby enhancing the signal to noise ratio (SNR) of the signal received by the shaper circuit portion 132). The shaper circuit portion 132 may include one or more operational amplifiers.

The discriminator circuit portion 133 in the illustrated embodiment is configured as a comparator or threshold device. The discriminator circuit portion 133 may be configured to distinguish true detection events from noise or other lower level signals. If the output of the shaper circuit portion 132 satisfies a threshold corresponding to a true detection event, the discriminator circuit portion 133 produces a signal. The signal produced by the discriminator circuit portion 133 activates the logic circuit portion 134, which operates a gate that allows the signal into the track and hold circuit portion 135, which captures a maximum amplitude of the signal and stores the maximum amplitude. The track and hold circuit portion 135 may include a diode and capacitor for storing the maximum amplitude. The track and hold circuit portion 135 may hold the maximum value until it may be read. For example, in the illustrated embodiment, the logic circuit portion 134 sends a request to the common readout 170, which may be an integral part of the ASIC that includes the input-channels or may be controlled by an FPGA. For example, when the common readout 170 receives a request for a particular track and hold circuit portion, the FPGA may direct a select signal along the same path to the logic circuit portion that transmitted the request, obtain a signal from the track and hold circuit portion corresponding to the maximum amplitude, and re-set the track and hold circuit portion for subsequent detection events.

As also seen in FIG. 1, the illustrated detector processing assembly 120 also includes an integrator circuit portion 141, a shaper circuit portion 142, a discriminator circuit portion 143, a logic circuit portion 144, and a track and hold circuit portion 145 that are a part of or associated with the second channel 140, which are generally similar to the corresponding portions discussed above in connection with the first channel 130. Further, the illustrated detector processing assembly 120 also includes an integrator circuit portion 151, a shaper circuit portion 152, a discriminator circuit portion 153, a logic circuit portion 154, and a track and hold circuit portion 155 that are a part of or associated with the third channel 150, which are generally similar to the corresponding portions discussed above in connection with the first channel 130. Also, the illustrated detector processing assembly 120 also includes an integrator circuit portion 161, a shaper circuit portion 162, a discriminator circuit portion 163, a logic circuit portion 164, and a track and hold circuit portion 165 that are a part of or associated with the fourth channel 160, which are generally similar to the corresponding portions discussed above in connection with the first channel 130. Accordingly, signals from each pixel of a detector may be processed through a corresponding input channel and provided to a readout channel for identification of detection events (e.g., photon impacts), and for use of the identified detection events to reconstruct an image.

In various embodiments, the input channels for a given group associated with a particular readout channel may be located within a common opening of the collimator 116. For example, in the illustrated embodiment, the collimator 116 is configured to be interposed between the pixelated detector 112 and an object to be imaged. The collimator 116 includes plural openings 118 that are configured to allow radiation from the object to impact the pixelated detector 112 within a predetermined range of angles of approach. The pixels of a particular group of input channels are disposed within a boundary defined by a corresponding opening of the collimator 116. For example, in the illustrated embodiment, the pixelated anodes 101, 102, 103, and 104 are communicably coupled to the input channels Q1, Q2, Q3, and Q4 (channels 130, 140, 150 and 160), respectively. The pixelated anodes 101, 102, 103, and 104 are also disposed within a boundary 105 corresponding to an opening 106 of the collimator 116. Accordingly, detection events from photons allowed to impact the pixelated detector 112 through the opening 106 are all processed through the readout channel R1 (or the first readout channel 180).

Figure 2:
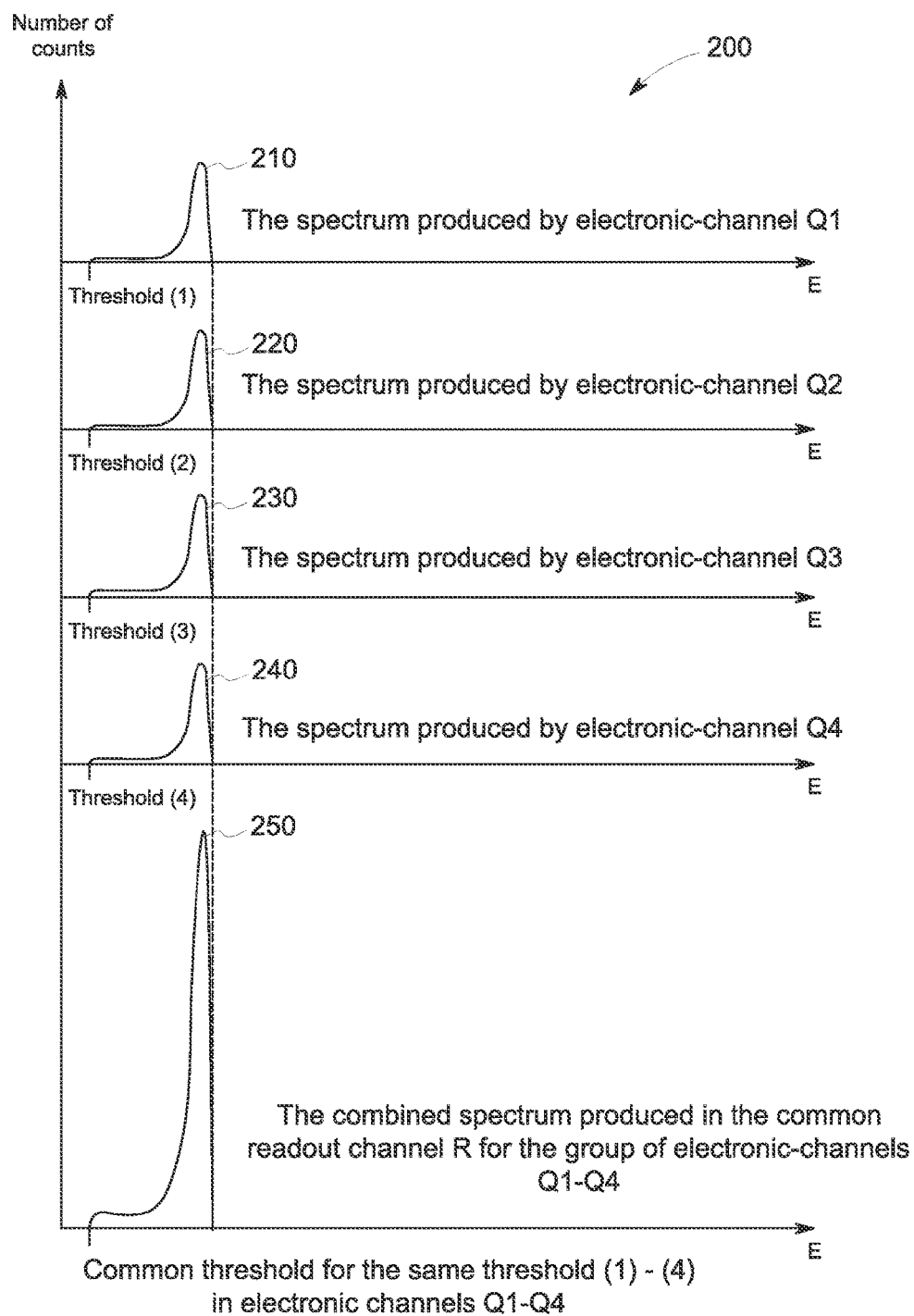
FIG. 2 depicts the combining of individual spectra of pixels of a group of pixels of the detector assembly of FIG. 1.

For the detector assembly 100 depicted in FIG. 1, all of the photons for a group of pixelated anodes disposed within a boundary of a particular opening 105 of the collimator are grouped in a common readout channel. FIG. 2 depicts the combining of individual spectrum of pixels of a group of pixels of the detector assembly 100. The vertical axis of graph 200 corresponds to count numbers and the horizontal axis corresponds to energy level. For example, as seen in the graph 200 of FIG. 2, the first input channel Q1 produces a spectrum 210. Similarly, the second input channel Q2 produces a spectrum 220, the third input channel Q3 produces a spectrum 230, and the fourth input channel Q4 produces a spectrum 240. The individual spectra are combined in the illustrated embodiment to provide a combined signal 250. As seen in the example of FIG. 2, the combined spectra overlap in energy level, such that the combined signal has about the same breadth (Full width Half Maximum—FWHM) as the individual signals. Accordingly, as energy resolution corresponds to breadth of signal, the combined signal has about the same energy resolution as the individual signals. Because the combined signal corresponds to an area 4 times the size of an individual pixel, by reducing the pixel size and combining the signals as in the example of FIG. 2, the energy resolution may be improved (that is, by using pixels ¼ of the size of a previous design, and combining four pixels into a group having a common readout, the energy resolution may be improved). However, it may be noted that the individual pixels may not be distinguished between in the combined signal 250. Thus, if the opening is the same size as a previous pixel, but the individual pixels are ¼ the size, the spatial resolution is similar.

Accordingly, with continued reference to FIG. 1, it may be noted that, in the illustrated embodiment, each opening 105 of the collimator 116 confines one or more pixels (in the depicted embodiment, each opening confines four pixels). Each pixel in the group of pixels is electrically coupled to a corresponding input channel, with the pixels in the group (i.e., the group confined within a particular opening of the collimator) sharing a common readout channel. The common readout channel produces a combined spectrum (e.g., combined signal 250 as seen in FIG. 2) of the individual spectra of the pixels confined within a given opening of the collimator. With reduced size pixels, each pixel has reduced leakage-current and capacitance, and, accordingly, improved or reduced energy resolution. The spectra of the group of pixels confined inside the collimator opening are combined to one common spectrum having improved energy resolution that is similar to the energy resolution of a single small pixel in the group of pixels. However, as seen in FIG. 2, the individual pixels 101, 102, 103 and 104 in opening 105 have the same and common address related to their corresponding readout channel 180 and thus may not be distinguished among in the combined signal of the readout channel. Accordingly, the intrinsic spatial resolution is equal to the sum of the intrinsic spatial resolutions of the pixels in the group of pixels confined by the collimator opening. The combined spectrum 250 is the digital sum of the digital spectra 210-240 produced after converting the analog output signals received from the input channels 130-160 into digital form, for example using an Analog to Digital Converter (ADC). Accordingly, such digital summing does not sum the leakage currents of pixels 101-104 and thus has energy-resolution similar to that of a small single pixel in the group of pixels including pixels 101-104. In the case that spectra 210-240 are not aligned to the same energy due to different gains and offsets associated with the detector pixels and the electronic channels producing spectra 210-240, then spectrum 250 might have energy resolution that is inferior to that of a single small pixels in the group of pixels including pixels 101-104. However, since pixels, such as pixels, 101-104 are adjacent to each other and are positioned in the same small area in the detector 112, and since the electronic channels 130-160 corresponding to pixels 101-104 are located in the same small area within the ASIC, all the gains and offsets associated with spectra 210-240 are uniform and about the same. Accordingly, the broadening of spectrum 250 by the misalignment of spectra 210-240 may be negligible.

The detector assembly of FIG. 1 may also achieve space savings, relative to total number of pixels or input channels. For example, in various embodiments, about one half of the area of an ASIC for a detector assembly may be used for the analog part of the electronic input channels (e.g., Q1, Q2, Q3 . . . Qn.) The other half may be used for a readout portion including individual readout channels. By reducing the number of readout channels, less space of an ASIC may be required. For example, when 4 pixels and corresponding input channels are assigned per readout unit, the total number of readout channels required is ¼ as many compared to a design including a separate readout channel per input channel (or pixel). If the half of the ASIC for the readout channels is reduced in size to ¼ relative to designs using individual readout channels for each pixel, than the total area required is ⅝ relative to designs using individual readout channels (as ½A+(¼*½A)=⅝A, where A is the previous area or area using individual readout channels for each pixel). Thus, for example, by using smaller pixels (¼ of a previous size) and combining 4 pixels per readout channel, energy resolution may be improved while reducing ASIC size by about 37.5%.

It may be noted that, in the embodiment of FIG. 1, each input channel and corresponding pixel has associated therewith a dedicated track and hold circuit portion. In some embodiments, additional space saving may be achieved by utilizing a track and hold circuit portion that is shared by plural input channels and corresponding pixels. For example, in some embodiments, at least one track and hold circuit portion is shared by the corresponding group of input channels that provide output signals to a shared readout channel. Put another way, a given group of input channels (e.g., a group of input channels corresponding to a group of pixels disposed within a common opening of a collimator) may share both a readout channel and a track and hold circuit portion. In some embodiments, each of the input channels of a corresponding group of input channels may include a discriminator circuit portion that is configured to place the input channel in electrical communication with the shared or common track and hold circuit portion based on a strength of a received signal from the pixelated detector by the corresponding input channel. The discriminators and/or corresponding gates or switches may be controlled such that only one signal from an input channel is allowed to pass through to the track and hold circuit portion over a given sampling period. The individual input channels may be disconnected from (e.g., not in electrical communication with) the track and hold circuit portion when not active (e.g., when not providing a signal satisfying a threshold corresponding to a true detection event) to prevent leakage current from the various input channels from combining. It may be noted that, as long as the number of input channels per readout channel is kept low enough relative to the event rate and sampling rate, the risk of conflicting events from different input channels of the same group will be low enough to be negligible.

Figure 3:
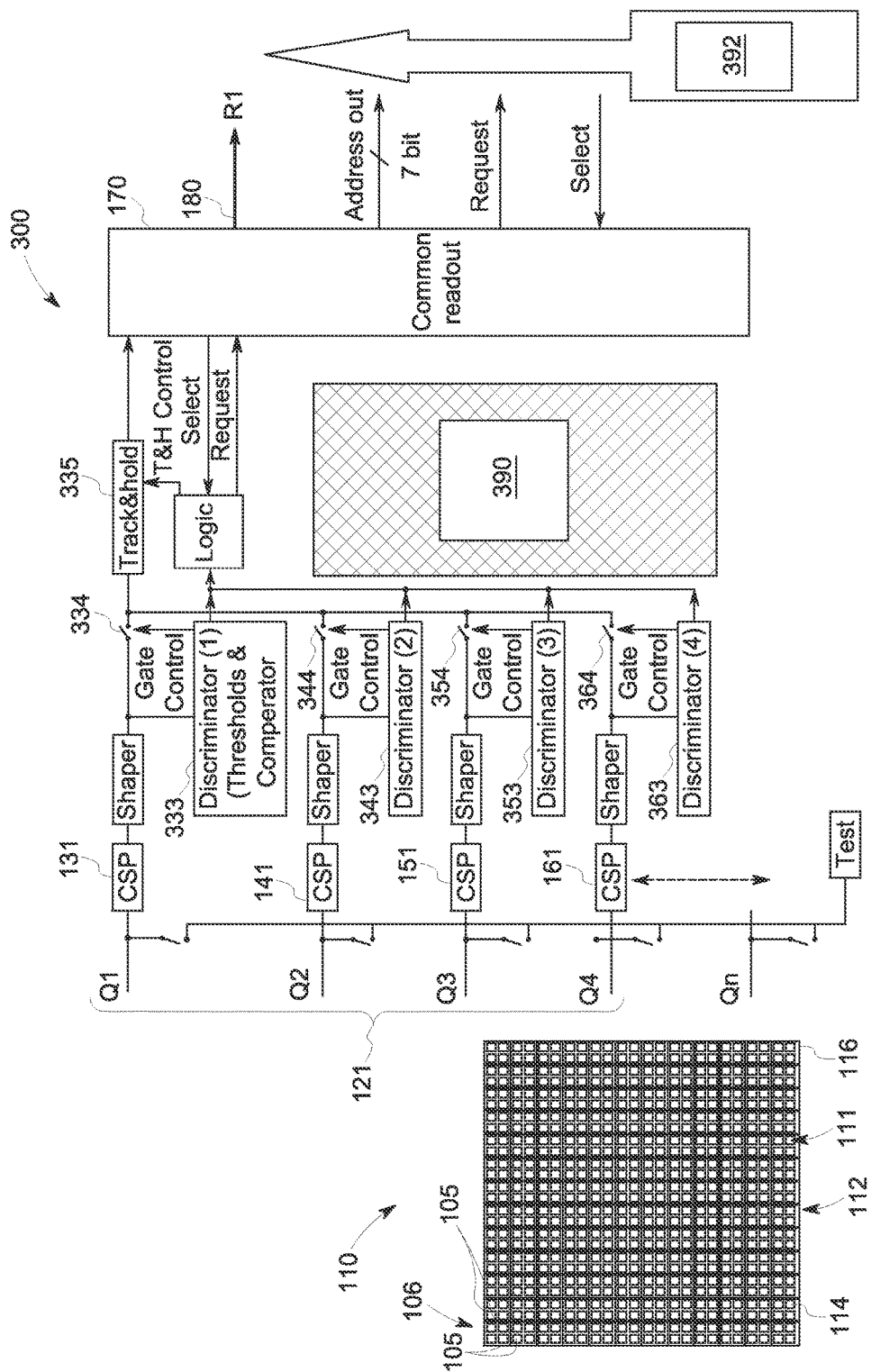
FIG. 3 provides a schematic view of a radiation detector assembly according to an embodiment.

FIG. 3 provides a schematic view of a radiation detector assembly 300 in accordance with various embodiments. The radiation detector assembly 300 may be generally similar in various respects to the radiation detector assembly 100 discussed in connection with FIG. 1, with like numerals in FIG. 3 denoting generally similar components or aspects as discussed in connection with FIG. 1. It may be noted that the radiation detector assembly 300 utilizes a shared track and hold circuit portion 335 for input channels Q1-Q4 of group 121.

In the depicted embodiment, the track and hold circuit portion 335 receives input signals from a first discriminator circuit portion 333 of a first channel Q1, from a second discriminator circuit portion 343 of a second channel Q2 (or 340), from a third discriminator circuit portion 353 of a third channel Q3 (or 350), and from a fourth discriminator circuit portion 363 of a fourth channel Q4 (or 360).

The first discriminator circuit portion 333 controls a corresponding gate 334 to place the first discriminator circuit portion 333 in electrical communication with the track and hold circuit portion 335 when the first discriminator circuit portion 333 receives a signal from the corresponding pixelated anode that satisfies a threshold corresponding to a true detection event. When the first discriminator circuit portion 333 does not receive such a signal from the corresponding pixelated anode, the gate 334 is maintained in an open position to prevent leakage current from the first channel Q1 from being combined with any other signal and/or leakage current. Similarly, the second discriminator circuit portion 343 controls a corresponding gate 344 to place the second discriminator circuit portion 343 in electrical communication with the track and hold circuit portion 335 when the second discriminator circuit portion 343 receives a signal from the corresponding pixelated anode that satisfies a threshold corresponding to a true detection event, the third discriminator circuit portion 353 controls a corresponding gate 354 to place the third discriminator circuit portion 353 in electrical communication with the track and hold circuit portion 335 when the third discriminator circuit portion 353 receives a signal from the corresponding pixelated anode that satisfies a threshold corresponding to a true detection event, and the fourth discriminator circuit portion 363 controls a corresponding gate 364 to place the fourth discriminator circuit portion 363 in electrical communication with the track and hold circuit portion 335 when the fourth discriminator circuit portion 363 receives a signal from the corresponding pixelated anode that satisfies a threshold corresponding to a true detection event. Each discriminator circuit portion may control the corresponding gate to place the discriminator circuit portion in electrical communication with the track and hold circuit portion only when a true detection event occurs, thereby avoiding the combining of leakage currents from the various input channels. Shortly after one of gates 334, 344, 354, or 364 is individually maintained closed for transmitting the signal of a true event, corresponding to one of the output signals of one of the input-channels Q1, Q2, Q3 or Q4, to common track and hold unit 335 and after the common readout unit 170 is reset following the reading of the true signal, this closed gate is switched into an open position to prevent leakage currents from the channels Q1-Q4 from being combined with each other or with any other signals.

Accordingly, by sharing a track and hold circuit portion among plural input channels (e.g., four input channels per track and hold circuit portion in the depicted example), additional space reduction (on a per pixel basis) may be achieved. As seen in FIG. 3, a first savings area 390 corresponds to saved area due to sharing track and hold circuit portions, and a second savings area 392 corresponds to saved area due to sharing readout channels. For example, with the track and hold and associated logic circuit portions occupying about ⅓ of the area for the input channels (which is about ½ of the total area A of the ASIC), when four pixels are grouped per track and hold circuit portion, and combined with the space savings for using one readout channel per four pixels, the ASIC size may be reduced by more than a factor of 2, i.e., $A/(½*⅔+½*¼)*A=24/11>2$, or cut in more than half. Thus, four times as many pixels (and input channels) may be utilized, while only requiring twice as much ASIC area.

In some embodiments, the signals from each input channel may be processed to allow for distinguishing among readout signals corresponding to each input channel to provide improved spatial resolution in addition to reduced size and improved energy resolution. For example, in some embodiments, each input channel may comprise a shaper circuit portion that is configured to offset a signal received by a corresponding pixel a predetermined distance (a predetermined energy in the X-axis of the spectrum corresponding to a predetermined offset voltage to the signal in the shaper) configured for identification of a particular input channel providing a given output signal.

Figure 4:
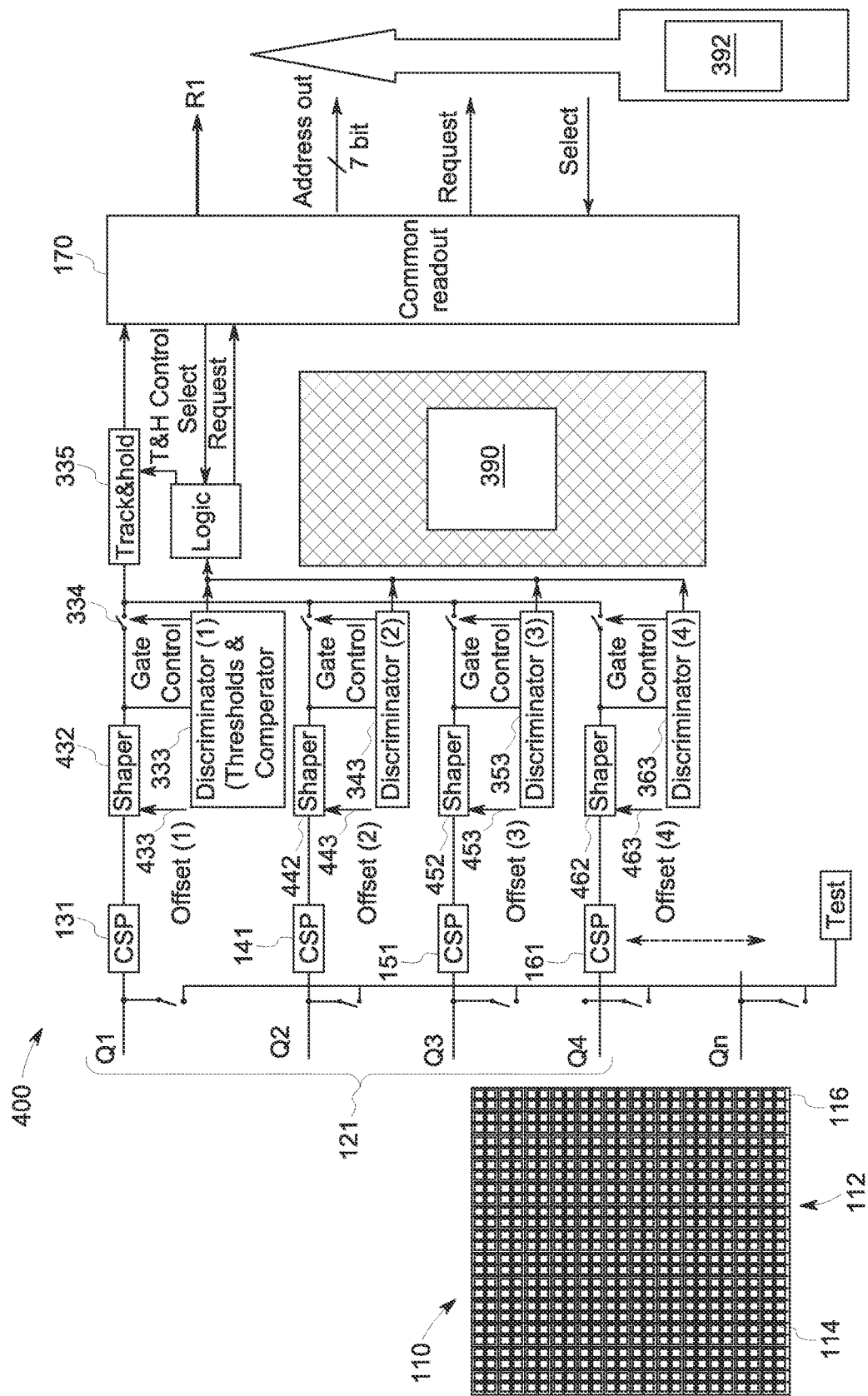
FIG. 4 provides a schematic view of a radiation detector assembly according to an embodiment.

FIG. 4 provides a schematic view of a radiation detector assembly 400 in accordance with various embodiments. The radiation detector assembly 400 may be generally similar in various respects to the radiation detector assembly 100 discussed in connection with FIG. 1 and the radiation detector assembly 300 discussed in connection with FIG. 3, with like numerals in FIG. 4 denoting generally similar components or aspects as discussed in connection with FIG. 1 and/or FIG. 3. It may be noted that each input channel of FIG. 4 includes a shaper circuit portion that is configured to offset the received signal a predetermined distance configured for identification of the pixel and/or input channel providing the signal input to the shaper circuit portion. Thus, even when the signals are combined with signals from other input channels and pixels, the individual pixels corresponding to each signal may be identified, improving spatial resolution.

As seen in FIG. 4, the depicted radiation detector assembly 400 includes a shaper circuit portion 432 for the first channel Q1 and a corresponding offset 433. The offset 433, for example, may provide a voltage offset to a signal received from the integrator circuit portion 131. Each channel may have a different voltage offset, facilitating identification of output signals originating from any particular channel. As also discussed in connection with FIG. 1, the shaper circuit portion 432 may include a band-pass filter, and be configured to remove noise (thereby enhancing the signal to noise ratio (SNR) of the signal received by the shaper circuit portion 432). The shaper circuit portion 432 may include one or more operational amplifiers. For example, the offset of the signal provided by the shaper circuit portion 432 may be provided via a voltage input to an operational amplifier. Similarly, the second channel Q2 includes a shaper circuit portion 442 and corresponding offset 443, the third channel Q3 includes a shaper circuit portion 452 and corresponding offset 453, and the fourth channel Q4 includes a shaper circuit portion 462 and corresponding offset 463. The offset amount for each channel in the illustrated embodiment is selected such that, when combined, the signals do not overlap and may be distinguished from each other.

Figure 5:
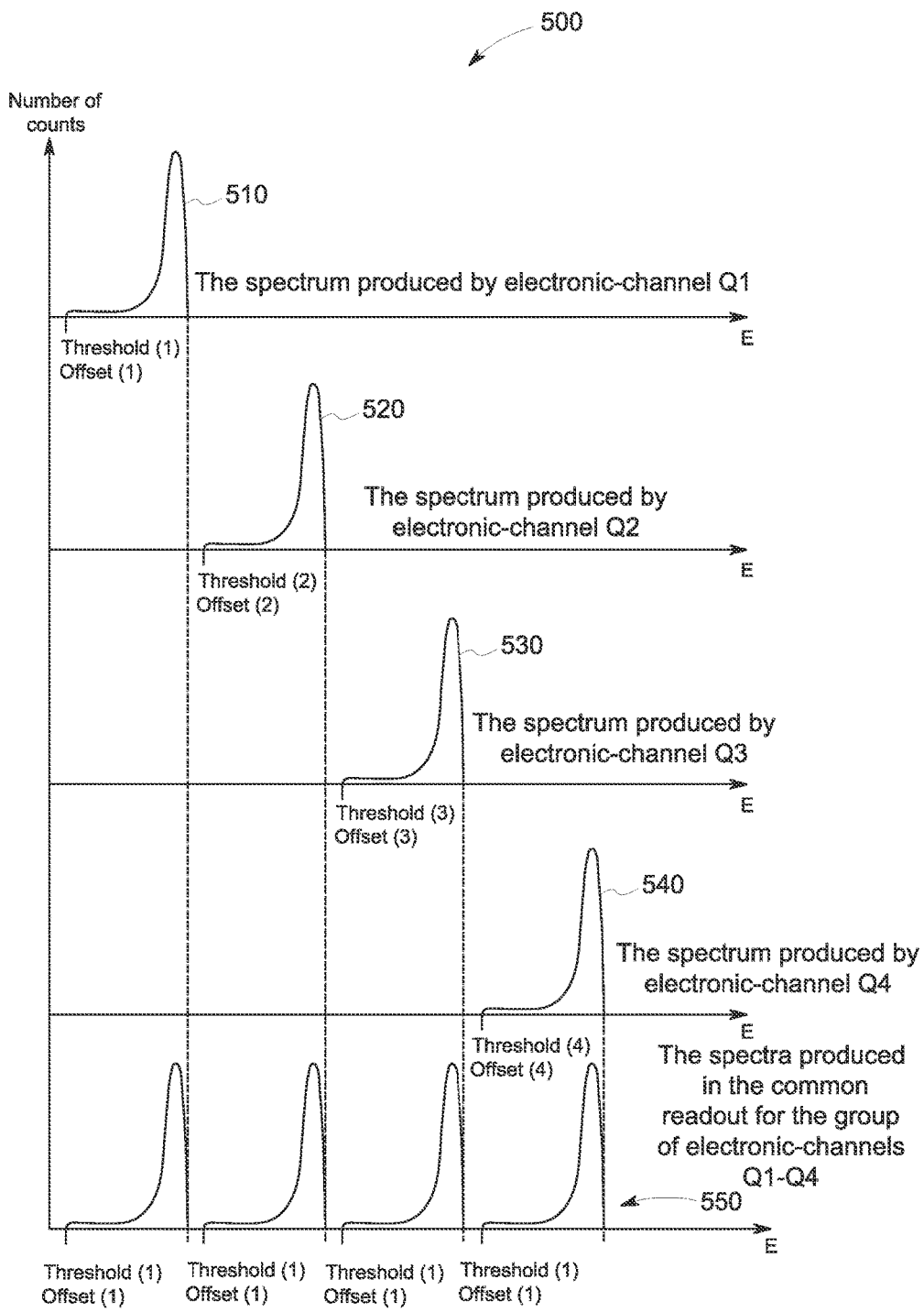
FIG. 5 depicts the combining of individual spectra of pixels of a group of pixels of the detector assembly of FIG. 4.

For the detector assembly 400 depicted in FIG. 4, similar to the detector assemblies of FIGS. 1 and 3, all of the photons for a group of pixelated anodes disposed within a boundary of a particular opening of the collimator are grouped in a common readout channel. Alternatively, each opening of the collimator may include only one small pixel and the group of pixels includes several pixels which are each confined by a dedicated small opening of the collimator. FIG. 5 depicts the combining of individual spectrum of pixels of a group of pixels of the detector assembly 400, with individual spectrum having a particular offset allowing identification of signals from particular individual pixels. The vertical axis of graph 500 corresponds to count numbers and the horizontal axis corresponds to energy level. For example, as seen in the graph 500 of FIG. 5, the first input channel Q1 produces a spectrum 510. Similarly, the second input channel Q2 produces a spectrum 520, the third input channel Q3 produces a spectrum 530, and the fourth input channel Q4 produces a spectrum 540. The individual spectra are combined in the illustrated embodiment to provide a combined signal 550. As seen in the example of FIG. 5, the combined spectra do not overlap in energy level. Accordingly, each spectrum has a similarly sized breadth allowing for similar energy resolution, while also allowing for improved spatial resolution in comparison with the example of FIG. 2.

It may be noted that, especially as the number of pixels per readout channel increases, the available dynamic range for the non-overlapped spectra is reduced. For example, a given ASIC may be able to measure only a given range of energy levels. Each individual spectra of each corresponding pixel in the group of pixels, without overlapping, may only occupy 1/n or less of the total range, with n being the number of pixels in the group per readout channel. Accordingly, the maximum number of pixels per readout channel may be limited by the available dynamic range, with the particular offsets chosen to prevent overlap of the individual spectra. However, it may further be noted that improvement of energy resolution is relatively more desired for low energy isotopes, which may have a peak energy less than ¼ of the intrinsic range of an ASIC, so that use of 4 pixels per readout channel may provide substantial space savings, while still allowing sufficient energy-range so that each individual spectra does not overlap any others for a given group of pixels sharing a readout channel. For the example depicted in FIG. 5, the energy resolution of the combined spectrum is similar to that of each of the relatively small pixels in the group of pixels coupled to a single readout channel. The combined spectrum includes multiple spectra that may be identified according to the corresponding offset. Accordingly, the intrinsic spatial resolution for the arrangement of FIG. 4 is equal to that of a single individual pixel. Accordingly, improvement in energy-resolution together with improvement of spatial-resolution is achieved while still reducing the ASIC size by a factor of more than 2.

Figure 6:
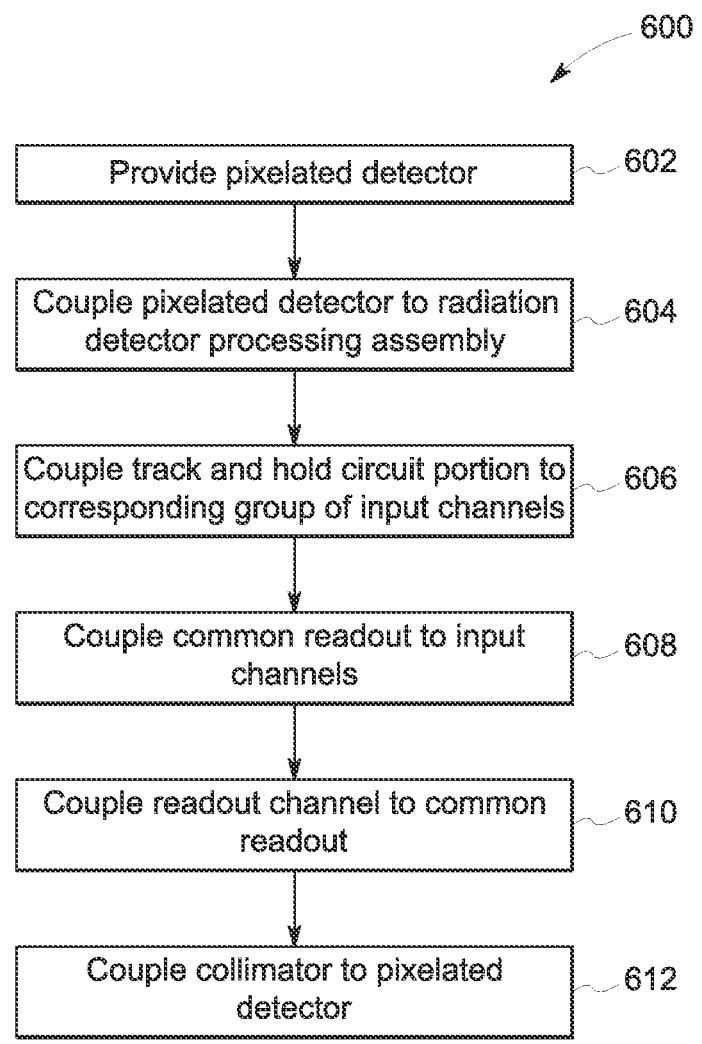
FIG. 6 shows a flowchart of a method, according to an embodiment.

FIG. 6 provides a flowchart of a method 600 for providing a detector or detector system, in accordance with various embodiments. The method 600, for example, may employ or be performed by structures or aspects of various embodiments (e.g., systems and/or methods and/or process flows) discussed herein. In various embodiments, certain steps may be omitted or added, certain steps may be combined, certain steps may be performed concurrently, certain steps may be split into multiple steps, certain steps may be performed in a different order, or certain steps or series of steps may be re-performed in an iterative fashion.

At 602, a pixelated detector (e.g., pixelated detector 112 of FIG. 1) is provided. The pixelated detector may be a semiconductor detector. Generally, the pixelated detector includes a surface and plural pixelated anodes disposed on the surface. Each pixelated anode is configured to generate a signal responsive to reception of a photon by the pixelated anode. A grid, matrix, or array of pixelated anodes may be disposed on a reception surface, with each pixelated anode configured to produce signals that are identifiable as being originated from the particular pixelated anode (e.g., having an address or other identifier associated therewith).

At 604, the pixelated detector is coupled to a radiation detector processing assembly (e.g., detector processing assembly 120). The radiation detector processing assembly includes at least one ASIC. Each pixelated anode of the pixelated detector is communicably coupled with a corresponding input channel of the radiation detector processing assembly. Each input channel is configured to receive an input corresponding to a detection event from the corresponding pixelated anode that is communicably coupled to the input channel.

At 606, in the illustrated embodiment, at least one track and hold circuit portion is coupled to the corresponding group of input channels, with the at least one track and hold circuit portion shared by the corresponding group of input channels providing output signals to the readout channel. In various embodiments, each of the input channels includes a discriminator circuit portion configured to place the input channel in electrical communication with the track and hold circuit portion based on a strength of a received signal from the pixelated detector by the input channel. Alternatively or additionally, each of the input channels may include a shaper circuit portion configured to offset the received signal a predetermined distance (a predetermined energy or a predetermined voltage offsets to the output signals) configured for identification for a particular input channel providing a given output signal. In alternate embodiments, each input channel may have a dedicated track and hold circuit portion.

At 608, a common readout is coupled to the plural input channels. The common readout, which may be integral part of the ASIC or include one or more FPGA's, is configured to receive a corresponding output signal from each input channel, with each corresponding output signal having a unique address identifying the corresponding input channel.

At 610, a readout channel is communicably coupled to the common readout. The readout channel is configured to receive a corresponding readout output from the common readout. The readout output includes output signals from a corresponding group of input channels. In some embodiments, the group of input channels may correspond to a group of pixels disposed within a shared opening of a collimator. For example, the group of input channels for a particular readout channel may correspond to four pixels disposed within a common opening of a collimator. In some embodiments, plural readout channels may be coupled to the common readout, with each readout channel configured to receive a corresponding readout output that includes output signals from a corresponding group of input channels.

At 612, a collimator is coupled to the pixelated detector. The collimator is configured to be interposed between the pixelated detector and an object being imaged. In some embodiments, the collimator includes plural openings, with the pixels corresponding to a particular group of input channels disposed within a boundary defined by a corresponding opening of the collimator. In the configuration when each pixel in the group of pixels can be identified using a specific and predetermined offset signal, each opening of the collimator may include only one small pixel and the group of pixels includes several pixels, with each confined by a small opening of the collimator containing a single small pixel.

Figure 7:
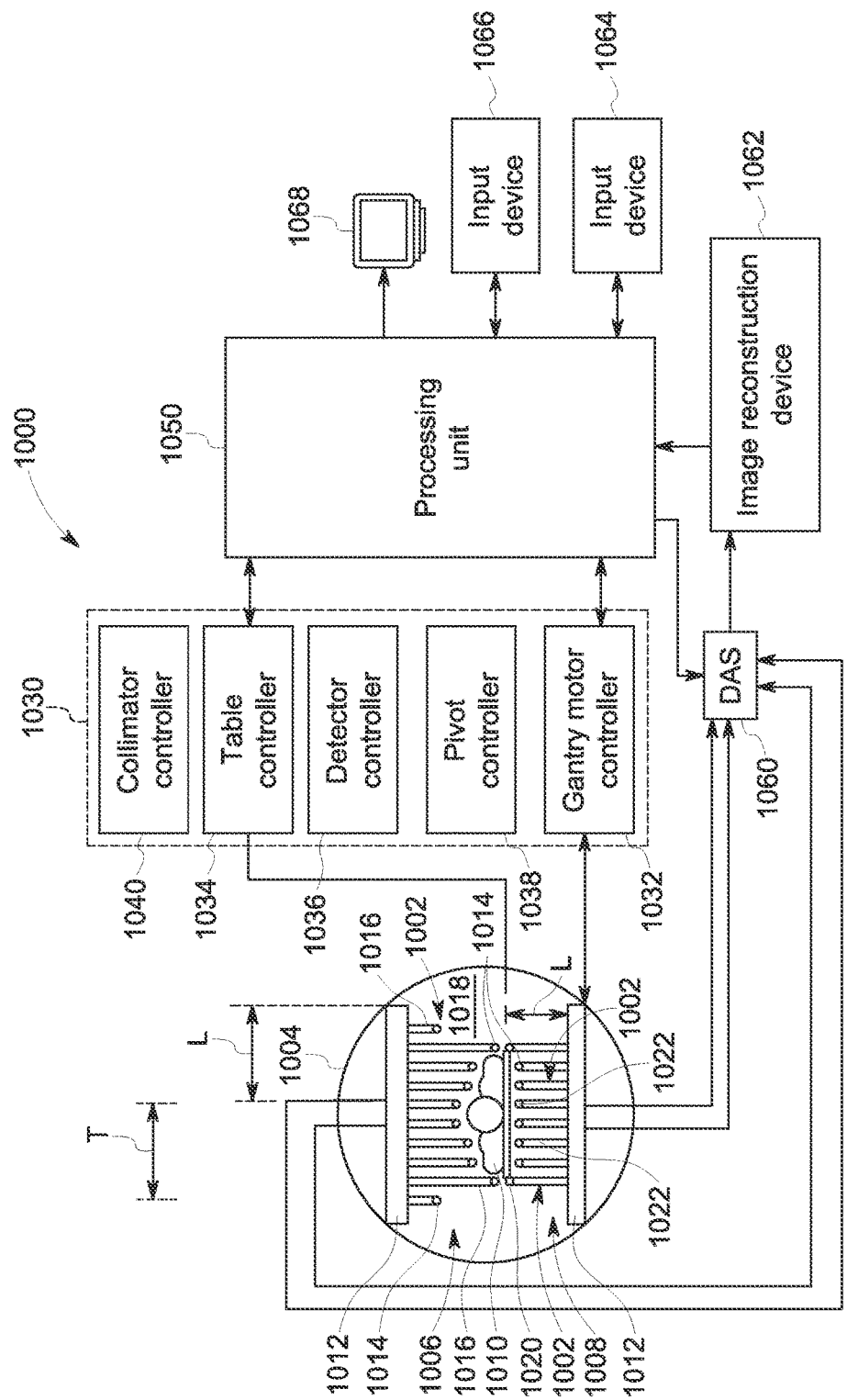
FIG. 7 shows a schematic view of an imaging system, according to an embodiment.

The invention described above and illustrated by FIGS. 1-6 may be implemented in medical imaging systems, such as, for example, SPECT, SPECT-CT, PET and PET-CT. Various methods and/or systems (and/or aspects thereof) described herein may be implemented using a medical imaging system. For example, FIG. 7 is a schematic illustration of a NM imaging system 1000 having a plurality of imaging detector head assemblies mounted on a gantry (which may be mounted, for example, in rows, in an iris shape, or other configurations, such as a configuration in which the movable detector carriers 1016 are aligned radially toward the patient-body 1010). It should be noted that the arrangement of FIG. 7 is provided by way of example for illustrative purposes, and that other arrangements (e.g., detector arrangements) may be employed in various embodiments. In the illustrated example, a plurality of imaging detectors 1002 are mounted to a gantry 1004. In the illustrated embodiment, the imaging detectors 1002 are configured as two separate detector arrays 1006 and 1008 coupled to the gantry 1004 above and below a subject 1010 (e.g., a patient), as viewed in FIG. 7. The detector arrays 1006 and 1008 may be coupled directly to the gantry 1004, or may be coupled via support members 1012 to the gantry 1004 to allow movement of the entire arrays 1006 and/or 1008 relative to the gantry 1004 (e.g., transverse translating movement in the left or right direction as viewed by arrow T in FIG. 7). Additionally, each of the imaging detectors 1002 includes a detector unit 1014, at least some of which are mounted to a movable detector carrier 1016 (e.g., a support arm or actuator that may be driven by a motor to cause movement thereof) that extends from the gantry 1004. In some embodiments, the detector carriers 1016 allow movement of the detector units 1014 towards and away from the subject 1010, such as linearly. Thus, in the illustrated embodiment the detector arrays 1006 and 1008 are mounted in parallel above and below the subject 1010 and allow linear movement of the detector units 1014 in one direction (indicated by the arrow L), illustrated as perpendicular to the support member 1012 (that are coupled generally horizontally on the gantry 1004). However, other configurations and orientations are possible as described herein. It should be noted that the movable detector carrier 1016 may be any type of support that allows movement of the detector units 1014 relative to the support member 1012 and/or gantry 1004, which in various embodiments allows the detector units 1014 to move linearly towards and away from the support member 1012.

Each of the imaging detectors 1002 in various embodiments is smaller than a conventional whole body or general purpose imaging detector. A conventional imaging detector may be large enough to image most or all of a width of a patient's body at one time and may have a diameter or a larger dimension of approximately 50 cm or more. In contrast, each of the imaging detectors 1002 may include one or more detector units 1014 coupled to a respective detector carrier 1016 and having dimensions of, for example, 4 cm to 20 cm and may be formed of Cadmium Zinc Telluride (CZT) tiles or modules. For example, each of the detector units 1014 may be 8×8 cm in size and be composed of a plurality of CZT pixelated modules (not shown). For example, each module may be 4×4 cm in size and have 16×16=256 pixels (pixelated anodes). In some embodiments, each detector unit 1014 includes a plurality of modules, such as an array of 1×7 modules. However, different configurations and array sizes are contemplated including, for example, detector units 1014 having multiple rows of modules.

It should be understood that the imaging detectors 1002 may be different sizes and/or shapes with respect to each other, such as square, rectangular, circular or other shape. An actual field of view (FOV) of each of the imaging detectors 1002 may be directly proportional to the size and shape of the respective imaging detector.

The gantry 1004 may be formed with an aperture 1018 (e.g., opening or bore) therethrough as illustrated. A patient table 1020, such as a patient bed, is configured with a support mechanism (not shown) to support and carry the subject 1010 in one or more of a plurality of viewing positions within the aperture 1018 and relative to the imaging detectors 1002. Alternatively, the gantry 1004 may comprise a plurality of gantry segments (not shown), each of which may independently move a support member 1012 or one or more of the imaging detectors 1002.

The gantry 1004 may also be configured in other shapes, such as a "C", "H" and "L", for example, and may be rotatable about the subject 1010. For example, the gantry 1004 may be formed as a closed ring or circle, or as an open arc or arch which allows the subject 1010 to be easily accessed while imaging and facilitates loading and unloading of the subject 1010, as well as reducing claustrophobia in some subjects 1010.

Additional imaging detectors (not shown) may be positioned to form rows of detector arrays or an arc or ring around the subject 1010. By positioning multiple imaging detectors 1002 at multiple positions with respect to the subject 1010, such as along an imaging axis (e.g., head to toe direction of the subject 1010) image data specific for a larger FOV may be acquired more quickly.

Each of the imaging detectors 1002 has a radiation detection face, which is directed towards the subject 1010 or a region of interest within the subject.

The collimators 1022 (and detectors) in FIG. 7 are depicted for ease of illustration as single collimators in each detector head. Optionally, for embodiments employing one or more parallel-hole collimators, multi-bore collimators may be constructed to be registered with pixels of the detector units 1014, which in one embodiment are CZT detectors. However, other materials may be used. Registered collimation may improve spatial resolution by forcing photons going through one bore to be collected primarily by one pixel. Additionally, registered collimation may improve sensitivity and energy response of pixelated detectors as detector area near the edges of a pixel or in-between two adjacent pixels may have reduced sensitivity or decreased energy resolution or other performance degradation. Having collimator septa directly above the edges of pixels reduces the chance of a photon impinging at these degraded-performance locations, without decreasing the overall probability of a photon passing through the collimator.

A controller unit 1030 may control the movement and positioning of the patient table 1020, imaging detectors 1002 (which may be configured as one or more arms), gantry 1004 and/or the collimators 1022 (that move with the imaging detectors 1002 in various embodiments, being coupled thereto). A range of motion before or during an acquisition, or between different image acquisitions, is set to maintain the actual FOV of each of the imaging detectors 1002 directed, for example, towards or "aimed at" a particular area or region of the subject 1010 or along the entire subject 1010. The motion may be a combined or complex motion in multiple directions simultaneously, concurrently, or sequentially.

The controller unit 1030 may have a gantry motor controller 1032, table controller 1034, detector controller 1036, pivot controller 1038, and collimator controller 1040. The controllers 1030, 1032, 1034, 1036, 1038, 1040 may be automatically commanded by a processing unit 1050, manually controlled by an operator, or a combination thereof. The gantry motor controller 1032 may move the imaging detectors 1002 with respect to the subject 1010, for example, individually, in segments or subsets, or simultaneously in a fixed relationship to one another. For example, in some embodiments, the gantry controller 1032 may cause the imaging detectors 1002 and/or support members 1012 to move relative to or rotate about the subject 1010, which may include motion of less than or up to 180 degrees (or more).

The table controller 1034 may move the patient table 1020 to position the subject 1010 relative to the imaging detectors 1002. The patient table 1020 may be moved in up-down directions, in-out directions, and right-left directions, for example. The detector controller 1036 may control movement of each of the imaging detectors 1002 to move together as a group or individually. The detector controller 1036 also may control movement of the imaging detectors 1002 in some embodiments to move closer to and farther from a surface of the subject 1010, such as by controlling translating movement of the detector carriers 1016 linearly towards or away from the subject 1010 (e.g., sliding or telescoping movement). Optionally, the detector controller 1036 may control movement of the detector carriers 1016 to allow movement of the detector array 1006 or 1008. For example, the detector controller 1036 may control lateral movement of the detector carriers 1016 illustrated by the T arrow (and shown as left and right as viewed in FIG. 10). In various embodiments, the detector controller 1036 may control the detector carriers 1016 or the support members 1012 to move in different lateral directions. Detector controller 1036 may control the swiveling motion of detectors 1002 together with their collimators 1022. In some embodiments, detectors 1002 and collimators 1022 may swivel or rotate around an axis.

The pivot controller 1038 may control pivoting or rotating movement of the detector units 1014 at ends of the detector carriers 1016 and/or pivoting or rotating movement of the detector carrier 1016. For example, one or more of the detector units 1014 or detector carriers 1016 may be rotated about at least one axis to view the subject 1010 from a plurality of angular orientations to acquire, for example, 3D image data in a 3D SPECT or 3D imaging mode of operation. The collimator controller 1040 may adjust a position of an adjustable collimator, such as a collimator with adjustable strips (or vanes) or adjustable pinhole(s).

It should be noted that motion of one or more imaging detectors 1002 may be in directions other than strictly axially or radially, and motions in several motion directions may be used in various embodiment. Therefore, the term "motion controller" may be used to indicate a collective name for all motion controllers. It should be noted that the various controllers may be combined, for example, the detector controller 1036 and pivot controller 1038 may be combined to provide the different movements described herein.

Prior to acquiring an image of the subject 1010 or a portion of the subject 1010, the imaging detectors 1002, gantry 1004, patient table 1020 and/or collimators 1022 may be adjusted, such as to first or initial imaging positions, as well as subsequent imaging positions. The imaging detectors 1002 may each be positioned to image a portion of the subject 1010. Alternatively, for example in a case of a small size subject 1010, one or more of the imaging detectors 1002 may not be used to acquire data, such as the imaging detectors 1002 at ends of the detector arrays 1006 and 1008, which as illustrated in FIG. 7 are in a retracted position away from the subject 1010. Positioning may be accomplished manually by the operator and/or automatically, which may include using, for example, image information such as other images acquired before the current acquisition, such as by another imaging modality such as X-ray Computed Tomography (CT), MM, X-Ray, PET or ultrasound. In some embodiments, the additional information for positioning, such as the other images, may be acquired by the same system, such as in a hybrid system (e.g., a SPECT/CT system). Additionally, the detector units 1014 may be configured to acquire non-NM data, such as x-ray CT data. In some embodiments, a multi-modality imaging system may be provided, for example, to allow performing NM or SPECT imaging, as well as x-ray CT imaging, which may include a dual-modality or gantry design as described in more detail herein.

After the imaging detectors 1002, gantry 1004, patient table 1020, and/or collimators 1022 are positioned, one or more images, such as three-dimensional (3D) SPECT images are acquired using one or more of the imaging detectors 1002, which may include using a combined motion that reduces or minimizes spacing between detector units 1014. The image data acquired by each imaging detector 1002 may be combined and reconstructed into a composite image or 3D images in various embodiments.

In one embodiment, at least one of detector arrays 1006 and/or 1008, gantry 1004, patient table 1020, and/or collimators 1022 are moved after being initially positioned, which includes individual movement of one or more of the detector units 1014 (e.g., combined lateral and pivoting movement) together with the swiveling motion of detectors 1002. For example, at least one of detector arrays 1006 and/or 1008 may be moved laterally while pivoted. Thus, in various embodiments, a plurality of small sized detectors, such as the detector units 1014 may be used for 3D imaging, such as when moving or sweeping the detector units 1014 in combination with other movements.

In various embodiments, a data acquisition system (DAS) 1060 receives electrical signal data produced by the imaging detectors 1002 and converts this data into digital signals for subsequent processing. However, in various embodiments, digital signals are generated by the imaging detectors 1002. An image reconstruction device 1062 (which may be a processing device or computer) and a data storage device 1064 may be provided in addition to the processing unit 1050. It should be noted that one or more functions related to one or more of data acquisition, motion control, data processing and image reconstruction may be accomplished through hardware, software and/or by shared processing resources, which may be located within or near the imaging system 1000, or may be located remotely. Additionally, a user input device 1066 may be provided to receive user inputs (e.g., control commands), as well as a display 1068 for displaying images. DAS 1060 receives the acquired images from detectors 1002 together with the corresponding lateral, vertical, rotational and swiveling coordinates of gantry 1004, support members 1012, detector units 1014, detector carriers 1016, and detectors 1002 for accurate reconstruction of an image including 3D images and their slices.

It should be noted that the particular arrangement of components (e.g., the number, types, placement, or the like) of the illustrated embodiments may be modified in various alternate embodiments. For example, in various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), one or more aspects of one or more modules may be shared between modules, a given module or unit may be added, or a given module or unit may be omitted.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation.

As used herein, the term "computer," "processor," or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer," "processor," or "module."

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A radiation detector processing assembly comprising at least one application specific integrated circuit (ASIC), the radiation detector processing assembly comprising:
   at least one track and hold circuit portion;
   plural input channels, each input channel configured to receive an input corresponding to a detection event from a pixel of a pixelated detector;
   a common readout operably coupled to the plural input channels, the common readout configured to receive a corresponding output signal from each input channel, each corresponding output signal having a unique address identifying the corresponding input channel; and
   a readout channel configured to receive a corresponding readout output from the common readout, the readout output comprising output signals from a corresponding group of input channels;
   wherein the at least one track and hold circuit portion is shared by the corresponding group of input channels providing output signals to the readout channel and wherein each of the input channels of the corresponding group of input channels comprises a discriminator circuit portion configured to place the input channel in electrical communication with the track and hold circuit portion based on a strength of a received signal from the pixelated detector by the input channel.

2. The radiation detector processing assembly of claim 1, further comprising plural readout channels configured to receive corresponding readout outputs comprising output signals from corresponding groups of input channels.

3. The radiation detector processing assembly of claim 1, wherein each of the input channels of the corresponding group of input channels comprises a shaper circuit portion configured to offset the received signal a predetermined distance corresponding to voltage or energy offset configured for identification of a particular input channel providing a given output signal.

4. The radiation detector processing assembly of claim 3, wherein the corresponding group of input channels comprises four input channels.

5. A radiation detector assembly comprising:
   a pixelated detector having a surface;
   plural pixelated anodes disposed on the surface, each pixelated anode configured to generate a signal responsive to reception of a photon by the pixelated anode; and
   a radiation detector processing assembly comprising at least one application specific integrated circuit (ASIC), the radiation detector processing assembly comprising:
   at least one track and hold circuit portion;
   plural input channels, each input channel operably coupled to a corresponding pixelated anode of the pixelated detector and configured to receive an input corresponding to a detection event from the corresponding pixelated anode;
   a common readout operably coupled to the plural input channels, the common readout configured to receive a corresponding output signal from each input channel, each corresponding output signal having a unique address identifying the corresponding input channel; and
   a readout channel configured to receive a corresponding readout output from the common readout, the readout output comprising output signals from a corresponding group of input channels;
   wherein the at least one track and hold circuit portion is shared by the corresponding group of input channels providing output signals to the readout channel and wherein each of the input channels of the corresponding group of input channels comprises a discriminator circuit portion configured to place the input channel in electrical communication with the track and hold circuit portion based on a strength of a received signal from the pixelated detector by the input channel.

6. The radiation detector assembly of claim 5, further comprising plural readout channels configured to receive corresponding readout outputs comprising output signals from corresponding groups of input channels.

7. The radiation detector assembly of claim 6, further comprising a collimator configured to be interposed between the pixelated detector and an object being imaged, the collimator comprising plural openings, wherein the pixelated anodes corresponding to a particular group of at least one input channel are disposed within a boundary defined by a corresponding opening of the collimator.

8. The radiation detector processing assembly of claim 5, wherein each of the input channels of the corresponding group of input channels comprises a shaper circuit portion configured to offset the received signal a predetermined distance corresponding to voltage or energy offset configured for identification of a particular input channel providing a given output signal.

9. The radiation detector processing assembly of claim 8, wherein the corresponding group of input channels comprises four input channels.

10. A method of providing a radiation detector assembly comprising:
    providing a pixelated detector having a surface and plural pixelated anodes disposed on the surface, each pixelated anode configured to generate a signal responsive to reception of a photon by the pixelated anode;
    operably coupling the pixelated detector to a radiation detector processing assembly comprising at least one application specific integrated circuit (ASIC) and at least one track and hold circuit portion, wherein each pixelated anode of the pixelated detector is communicably coupled with a corresponding input channel of the radiation detector processing assembly, each input channel configured to receive an input corresponding to a detection event from the corresponding pixelated anode of the pixelated detector, each input channel including at least one of a dedicated discriminator or a dedicated shaper for the corresponding input channel;
    communicably coupling a common readout to the plural input channels, the common readout configured to receive a corresponding output signal from each input channel, each corresponding output signal having a unique address identifying the corresponding input channel; and
    communicably coupling a readout channel to the common readout, the readout channel configured to receive a corresponding readout output from the common readout, the readout output comprising output signals from a corresponding group of input channels, wherein the at least one track and hold circuit portion is shared by the corresponding group of input channels providing output signals to the readout channel and wherein each of the input channels of the corresponding group of input channels comprises a discriminator circuit portion configured to place the input channel in electrical communication with the track and hold circuit portion based on a strength of a received signal from the pixelated detector by the input channel.

11. The method of claim 10, further comprising communicably coupling plural readout channels to the common readout, the plural readout channels configured to receive corresponding readout outputs comprising output signals from corresponding groups of input channels.

12. The method of claim 11, further comprising coupling a collimator to the pixelated detector, the collimator configured to be interposed between the pixelated detector and an object being imaged, the collimator comprising plural openings, wherein the pixels corresponding to a particular group of at least one input channel are disposed within a boundary defined by a corresponding opening of the collimator.

13. The method of claim 10, wherein each of the input channels of the corresponding group of input channels comprises a shaper circuit portion configured to offset the received signal a predetermined distance corresponding to voltage or energy offset configured for identification of a particular input channel providing a given output signal.

14. The method of claim 13, wherein the corresponding group of input channels comprises four input channels.

* * * * *